(12) United States Patent
Fingerhuth et al.

(10) Patent No.: US 11,415,894 B2
(45) Date of Patent: Aug. 16, 2022

(54) PROJECTION EXPOSURE SYSTEM FOR SEMICONDUCTOR LITHOGRAPHY HAVING AN OPTICAL ARRANGEMENT

(71) Applicant: Carl Zeiss SMT GmbH, Oberkochen (DE)

(72) Inventors: Judith Fingerhuth, Aalen (DE); Norbert Wabra, Werneck (DE); Sonja Schneider, Oberkochen (DE); Ferdinand Djuric-Rissner, Aalen (DE); Peter Graf, Königsbronn (DE); Reimar Finken, Westhausen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/380,231

(22) Filed: Jul. 20, 2021

(65) Prior Publication Data
US 2021/0349399 A1 Nov. 11, 2021

Related U.S. Application Data

(63) Continuation of application No. PCT/EP2020/052131, filed on Jan. 29, 2020.

(30) Foreign Application Priority Data

Jan. 30, 2019 (DE) .......................... 102019201147.0

(51) Int. Cl.
*G03F 7/20* (2006.01)

(52) U.S. Cl.
CPC ................................ *G03F 7/70191* (2013.01)

(58) Field of Classification Search
CPC .................................................... G03F 7/70191
USPC .................................................. 359/811–820
See application file for complete search history.

(56) References Cited

U.S. PATENT DOCUMENTS

| | | | |
|---|---|---|---|
| 6,967,756 B2* | 11/2005 | Van Dijsseldonk | G03F 7/70266 359/198.1 |
| 9,891,534 B2* | 2/2018 | Kwan | G03F 7/70266 |
| 2002/0011573 A1 | 1/2002 | Van Dijsseldonk et al. | |

FOREIGN PATENT DOCUMENTS

| | | |
|---|---|---|
| DE | 19827603 A1 | 12/1999 |
| DE | 10 2006 047 666 A1 | 4/2008 |
| DE | 10 2014 209 149 A1 | 10/2015 |

OTHER PUBLICATIONS

Translation of International Search Report for corresponding PCT Appl No. PCT/EP2020/052131, dated May 6, 2020.

* cited by examiner

*Primary Examiner* — Hung V Nguyen
(74) *Attorney, Agent, or Firm* — Fish & Richardson P.C.

(57) ABSTRACT

A projection exposure apparatus for semiconductor technology includes an optical arrangement with an optical element having an optically effective surface. The optical arrangement also includes an actuator embedded in the optical element. The actuator is outside the optically effective surface and outside the region located behind the optically effective surface. The optical arrangement is set up to deform the optically effective surface.

20 Claims, 5 Drawing Sheets

PROJECTION EXPOSURE SYSTEM FOR SEMICONDUCTOR LITHOGRAPHY HAVING AN OPTICAL ARRANGEMENT

CROSS-REFERENCE TO RELATED APPLICATIONS

The present application is a continuation of, and claims benefit under 35 USC 120 to, international application PCT/EP2020/052131, filed Jan. 29, 2020, which claims benefit under 35 USC 119 of German Application No. 10 2019 201 147.0 of Jan. 30, 2019. The entire disclosure of these applications are incorporated by reference herein.

FIELD

The disclosure relates to a projection exposure apparatus for semiconductor lithography with an optical arrangement.

BACKGROUND

Projection exposure apparatuses for semiconductor lithography include a light source and an illumination system for shaping the used radiation, i.e., the radiation used to image a structure onto an object coated with a light-sensitive layer. Furthermore, projection exposure apparatuses include a projection lens with a plurality of optical elements, which can be embodied as single lenses or mirrors. The quality of the imaging depends on external influences, such as, for example, pressure variations and temperature changes, and on the quality of the illumination and the projection optics. Aberrations which have as a consequence insufficient imaging of the structure are generated, for example, by the heating of optical elements as a result of absorbing used radiation. To correct the aberrations caused by the external influences and/or the heating of the optical elements, the illumination system and the projection optics include manipulators. These can set the position and situation of the optical elements in the nanometer range or sub-nanometer range and thus ensure the desired imaging quality. Moreover, it is known to use manipulators which are able to deform an optical element, which can have as a consequence that further degrees of freedom are available for correcting aberrations.

German patent application DE 19827603 A1 discloses a deformation manipulator which includes a holder, actuators and an optical element. The actuators press against the holder which subsequently deforms, leading to the deformation of the optical element as a result. By way of example, second harmonic deformation is generated by arranging two diametrically opposed actuators in each case, the forces of which act on the holder in the opposite direction.

On account of the short wavelength of the used light of typically 5 nm to 20 nm, reflecting optical elements, such as for example mirrors, are typically used in EUV projection exposure apparatuses. Unlike lenses, such mirrors are not usually held in holders but are often connected to a base of the projection exposure apparatus only via actuators which are able to position the mirrors in up to six degrees of freedom. Because there are no holders, there may be no counter bearings for the actuators used to deform the mirror. Connecting the deformation actuators to the same base as the positioning actuators can lead to an unwanted overdetermined system.

SUMMARY

The present disclosure seeks to provide a device which resolves limitations in certain known technology.

According to an aspect, the disclosure provides a projection exposure apparatus for semiconductor technology includes an optical arrangement with an optical element with an optically effective surface and an actuator, wherein the optical arrangement is set up to deform the optically effective surface. Here, the actuator is embedded in the optical element. In this context, embedded means that the actuator is integrated into the optical element itself, for example arranged in a cutout of the optical element, and therefore is not, as is known from the prior art, arranged between a holder and the optical element or in the holder.

For example, the actuator can be at least partly in direct contact with the optical element. Therefore, the actuator directly acts on the optical element at a contact surface, without further material such as an adhesive, for example, being present. This can avoid effects due to adhesive creepage or to damage to an adhesive layer by the short-wavelength used radiation.

Further, the actuator can be embedded in a prestressed state. As a result, a deformation of the optically effective surface from a target surface form, which was specified by the design, in a first and a second direction can be set even in the case of direct contact between the actuator and the optical element where no tensile forces can be transferred, such as in the case of an integration of the actuator without an adhesive layer. The actuator is installed with prestress into the optical element, the latter being configured such that a deformation of the target surface in a first direction has been preset. Following the installation, the actuator can relax into its zero position and can deform the optical element in the process so that the optically effective surface virtually adopts its target surface. From this position, it is now possible to set a deformation in a first and a second direction by shortening or expanding the actuator. It is likewise conceivable for the optical element to have a maximum deformation in one direction in the case of a non-deflected actuator and already develop a certain corrective effect in this state. Then, the desired target surface form, for example a neutral state of the optically effective surface, can be set by expansion of the actuator. In this context, a neutral state should be understood to be a state in which the manipulator exhibits no corrective effect. Then, the optical element can be deformed in a second direction by way of a further expansion of the actuator, for example in order to achieve an opposing corrective effect in relation to the first state.

In some embodiments, embedding the actuator in a prestressed state results in the clamping thus attained to allow the actuator to be held in the optical element purely by way of frictional forces and the use of an organic adhesive, for example, becomes superfluous. As a result, contamination of the optical surfaces by outgassing adhesives can be avoided, even in high vacuum environments such as in EUV projection exposure apparatuses, for example.

By way of example, the deformation of the optically effective surface can be caused by a laterally acting force of the actuator. For example, in the case of at least approximately spherical mirrors, lateral is the direction perpendicular to the optical axis of the optical element. In the case of curved mirrors, likewise such as in the case of at least approximately spherical mirrors, for example as used in EUV projection exposure apparatuses, an optical axis is understood to be the axis perpendicular to the mirror surface which runs through the vertex of the mirror.

In the case of free-form surfaces, where it is not possible to specify a unique optical axis, lateral should be understood to be the direction running perpendicular to the local surface normal.

In some embodiments, the point of application of the force of the actuator can be level with the neutral axis of the optical element. In the field relating to the strength of materials, the neutral axis refers to that filament or layer of a beam cross section whose length does not change when the beam twists or bends. Bending or twisting loads do not cause a tensile or compressive stress there. No moment is introduced into the optical element by the introduction of force into the neutral axis; this may be desirable for certain applications.

Besides, a point of application of the force of the actuator can be above or below the level of the neutral axis of the optical element. This can lead to a lever between the point of application of the force and the neutral axis, as a result of which a warping moment can be introduced into the optical element.

For example, the actuator can be arranged outside of the optically effective surface of the optical element. In this context, outside means that the actuators are not arranged in the optically effective surface and not under the optically effective surface either. Furthermore, the actuators can be arranged in such a way that there is no interaction between a cutout for receiving the actuator and the optically effective surface during the production of the optical element. Thus, for example, an introduction of stress as a result of manufacturing the cutout can relax by further material ablation at the optically effective surface and thus lead to new deformations again. Furthermore, the cutout can be arranged in such a way that no unwanted deformations are introduced into the very precise optically effective surface when installing the actuator.

In some embodiments, a desired deformation of the optically effective surface can be caused by an expansion of the actuator in its principal direction of motion, i.e., the direction in which the greatest path is traversed or the greatest force is generated when the actuator is actuated.

Furthermore, the deformation of the optically effective surface can be caused by an expansion of the actuator perpendicular to its principal direction of motion. The transmission ratio between the principal direction of motion and the direction perpendicular thereto can allow steps to be set with a higher resolution.

In certain embodiments, the contact to the optical element can be established at an end surface of the actuator, wherein the end surface is defined as a surface whose normal direction points in the direction of the direction of principal extent of the actuator. Attachment to the end surfaces can be desirable in that, if the extent of the actuator changes within the method, no friction can occur between the lateral surface of the actuator and the cutout in the optical element. This can avoid stick-slip frictional effects which could interfere with closed-loop control of the actuator.

Additionally, the contact to the optical element being established at least at one portion of the lateral surface of the actuator may be desirable when using the expansion direction perpendicular to the direction of principal extent of the actuator for the purposes of deforming the optical element. In this case, the lateral surface is the surface of the actuator extending parallel to the direction of principal extent of the actuator. While the actuator can move unimpeded in its direction of principal extent, the contact region in the expansion direction used for the deformation can be reduced to a minimum. As a result, the stick-slip friction between actuator and optical element in the direction of principal extent of the actuator can be reduced to a region where it is negligible in respect of closed-loop control.

In some embodiments, the force of the actuators can form a second harmonic, third harmonic or higher harmonic tangential deformation on the optically effective surface. A tangential deformation is understood to be an angle-dependent deformation, such as a deformation that does not lead to a more than two-fold rotationally symmetric deformation of the optical element. In the case of a second harmonic deformation, the shape of the optically effective surface corresponds to a saddle; thus, the edge of the optically effective surface describes a double sine curve. Alternatively, the surface can be described using a Zernike polynomial. These are orthogonal polynomials which are composed of the product of a radius-dependent part, i.e., a radial component, and an angle-dependent part, i.e., a tangential component. By way of example, four actuators can be embedded in the optical element with an offset of 90° for the purposes of a second harmonic deformation of the optically effective surface. Two actuators that are opposite one another can be deflected in the same direction in each case, with the deflection of the two actuator pairs being in the opposite sense. As a result, the optically effective surface can be deformed in a first direction parallel to the optical axis at the points of application of the first actuator pair and deformed counter to the first direction at the points of application of the second actuator pair, leading to a tangential second harmonic deformation of the optically free surface. The deformation can depend on the geometry and material properties of the optical element. The latter can be embodied such that the optical element has no deformations at the points of application of the actuators which are provided to set the situation and position of the optical element. This can be desirable because setting the position and the situation of the optical element, which may be embodied, for example, as a single lens or mirror of a projection exposure apparatus, can be carried out independently of the deformation of the optically effective surface.

By way of example, the actuator can be a piezo element. Other suitable actuators can also be used.

Investigations have shown that the deformation of the optically effective surface with simple deformations, i.e., second harmonic and third harmonic deformations, in combination with the positioning and the situation control of the optical elements can lead to comparable correction possibilities for the imaging properties of projection exposures apparatuses in comparison with very complex deformations. Complex deformations include additional higher order tangential deformations, i.e., higher harmonic deformations, and also radial deformations of the optically effective surface, which would typically lead to a large number of actuators, which would be additionally arranged below the optically effective surface in order to be able to realize radial deformations.

BRIEF DESCRIPTION OF THE DRAWINGS

Exemplary embodiments and variants of the disclosure are explained in more detail in the following text with reference to the drawings, in which.

DESCRIPTION OF EXEMPLARY EMBODIMENTS

Figure 1:
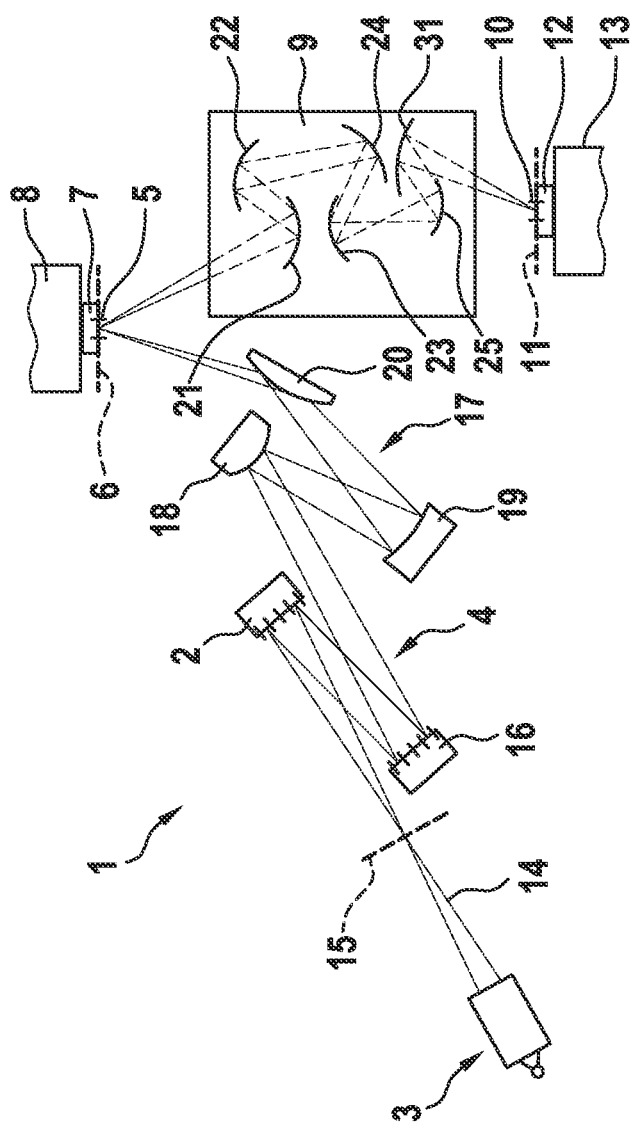
FIG. 1 shows the basic construction of an EUV projection exposure apparatus in which the disclosure can be implemented.

FIG. 1 shows an example of the basic structure of a microlithographic EUV projection exposure apparatus 1 in which the disclosure can be used. An illumination system of the projection exposure apparatus 1 has, in addition to a light source 3, an illumination optical unit 4 for the illumination of an object field 5 in an object plane 6. EUV radiation 14 in the form of optical used radiation generated by the light source 3 is aligned via a collector, which is integrated in the light source 3, in such a way that it passes through an intermediate focus in the region of an intermediate focal plane 15 before it is incident on a field facet mirror 2. Downstream of the field facet mirror 2, the EUV radiation 14 is reflected by a pupil facet mirror 16. With the aid of the pupil facet mirror 16 and an optical assembly 17 having mirrors 18, 19 and 20, field facets of the field facet mirror 2 are imaged into the object field 5.

A reticle 7 arranged in the object field 5 and held by a schematically illustrated reticle holder 8 is illuminated. A projection optical unit 9 with optical elements embodied as mirrors 21-25 and 31, illustrated merely schematically, serves for imaging the object field 5 into an image field 10 in an image plane 11. A structure on the reticle 7 is imaged on a light-sensitive layer of a wafer 12 arranged in the region of the image field 10 in the image plane 11 and held by a likewise partly represented wafer holder 13. The light source 3 can emit used radiation, such as in a wavelength range of between 5 nm and 120 nm.

The disclosure can likewise be used in a DUV apparatus, which is not illustrated. A DUV apparatus is set up in principle like the above-described EUV apparatus 1, wherein mirrors and single lenses can be used as optical elements in a DUV apparatus and the light source of a DUV apparatus emits used radiation in a wavelength range of 100 nm to 300 nm.

Figure 2:
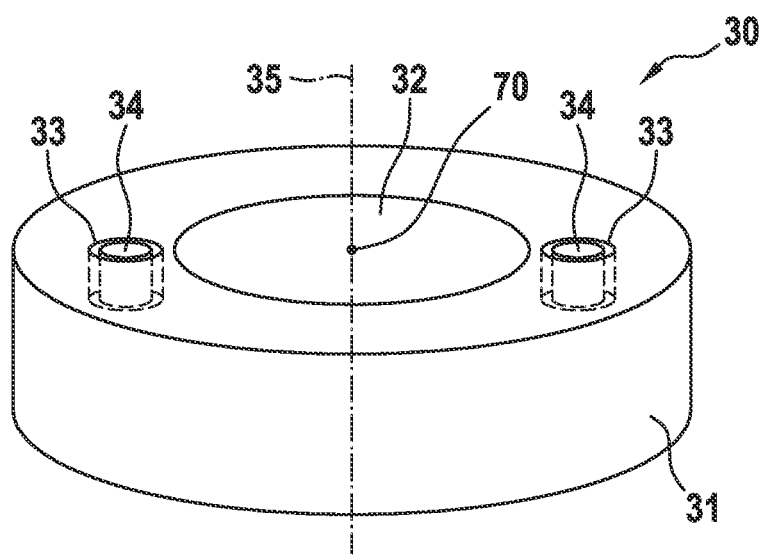
FIG. 2 shows a schematic view of an optical arrangement according to the disclosure.

FIG. 2 shows a schematic illustration of an exemplary optical arrangement 30 which includes the optical element 31 embodied in the example shown as a concave mirror with an optically effective surface 32. The optically effective surface 32 is the region of the optical element 31 which is illuminated by the used radiation when a structure is imaged onto an object. The optical element 31 includes an optical axis 35 which is perpendicular to the optically effective surface 32 at the vertex 70 of the optical element 31. Cutouts 33 are formed in the optical element 31 and actuators 34 embodied as piezo elements are arranged therein. Alternatively, any other type of actuator that meets the demands, such as for example travel or increment, can also be used.

Figure 3:
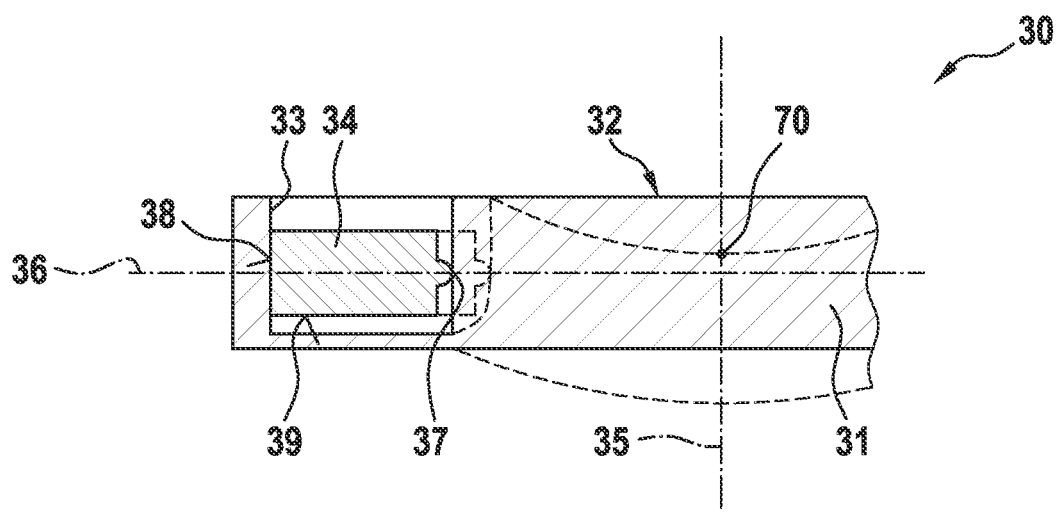
FIG. 3 shows a schematic detailed illustration of the optical arrangement of FIG. 2.

FIG. 3 shows a schematic detailed view of the optical arrangement 30 in a sectional illustration. The actuator 34 is embedded in the cutout 33 and is in direct contact, i.e., without a connecting layer such as an adhesive for example, with the optical element 31 by way of its end surface 38 and a contact point 37. The lateral surfaces 39 of the actuator 34 have a sufficient distance from the inner side of the cutout 33 such that contact between the actuator 34 and the inner side of the cutout 33 is precluded in the case of a change in the extent of the actuator 34 perpendicular to the direction of principal extent. The contact point 37 is embodied as an arch, as a result of which there is a defined point for introducing force between the actuator 34 and the optical element 31. The force of the actuator 34 acts laterally level with the neutral axis 36 on the optical element 31 such that no moments act on the optical element 31. The introduced force leads to a deviation of the optical element 31, as indicated by the dashed lines in FIG. 3. In the process, the vertex 70 of the optical element 31 can move along the optical axis 35. This displacement along the optical axis 35 can be compensated again by actuators (not illustrated) for the position and situation of the optical element. The actuators 34 are installed with prestress such that the optically effective surface 32 is deformed in one direction from its target surface form specified by the design, as illustrated by the solid lines in FIG. 3, as a result of an expansion of the actuator 34. A reduction in the extent of the actuator 34 deforms the optically effective surface 32 in an opposite second direction, which is not illustrated in FIG. 3 for reasons of clarity. Thus, the optical element 31 has maximum deformation in one direction in the case of a non-deflected actuator 34. The target surface form of the optically effective surface 32 can be set by expanding the actuator 34 and the optical element 31 can be deformed in a second direction by a further expansion of the actuator 34. Expediently, the optical element 31 with the cutout 33 and the optically effective surface 32 should be designed such that the latter has a desired surface form corresponding to a deformation, such as for example a saddle, in comparison with the target surface in the non-deflected state of the actuator 34.

Figure 4:
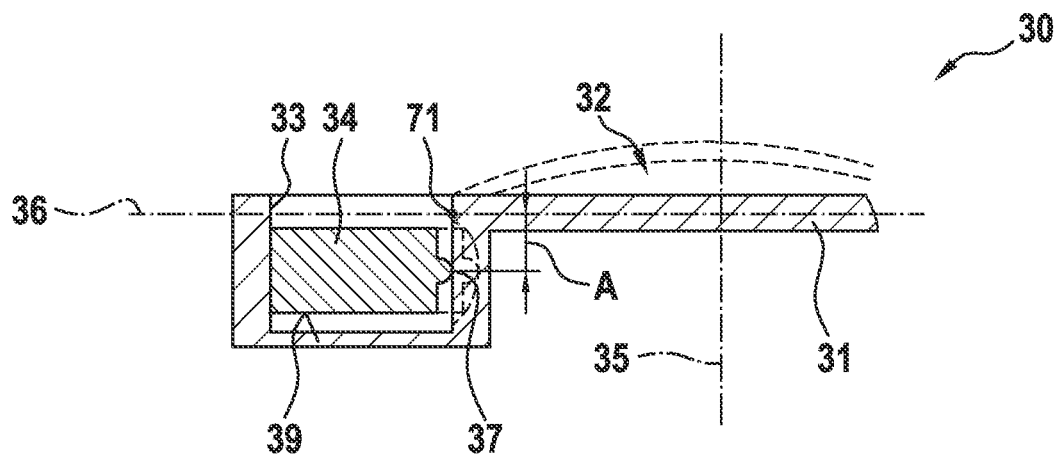
FIG. 4 shows a schematic detailed illustration of a further exemplary embodiment of the disclosure.

FIG. 4 shows a schematic illustration of a further exemplary embodiment of the disclosure, which has an identical embodiment to the exemplary embodiment described in FIG. 3 apart from the deviations described below. In contrast to the exemplary embodiment described in FIG. 3, the actuator 34 with the contact point 37 is in contact with the cutout 33 at a distance A below the neutral axis 36 of the optical element 31. The distance A leads to a moment with the lever arm A about the point of intersection 71 of the neutral axis 36 and the plane of the cutout 33, in which the contact point 37 of the actuator 34 abuts. The cross section of the optical element 31 under the optically effective surface 32 is tapered in comparison with the region outside of the optically effective surface 32 in order to simplify the deformation of the optical element 31 by the moment. What was stated in the description of FIG. 3 in respect of the installation of the actuator 34 in the prestressed state and the design of the optical element 31 applies.

Figure 5:
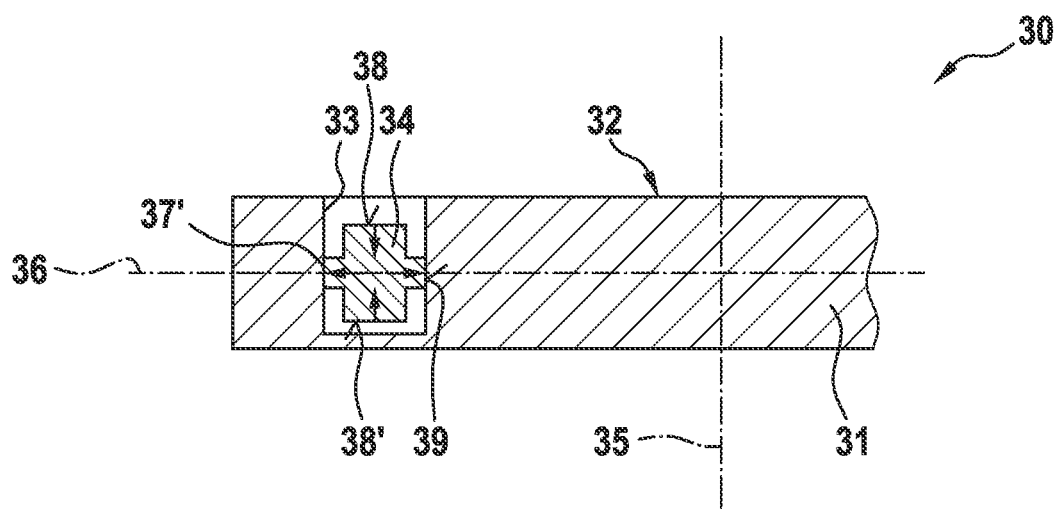
FIG. 5 shows a schematic detailed illustration of a further exemplary embodiment of the disclosure.

FIG. 5 shows a schematic illustration of a further exemplary embodiment. The actuator 34 is arranged in the cutout 33 in such a way that the lateral force level with the neutral axis 36 is brought about by an expansion perpendicular to the direction of principal extent of the actuator 34. Expediently, the contact point 37' of the actuator 34 with the cutout 33 is formed on the lateral surface 39 of the actuator 34. The end surfaces 38, 38' of the actuator 34 have a sufficient distance from the cutout 33 such that an expansion of the actuator in its direction of principal extent does not lead to contact with the cutout 33. Furthermore, what was stated in the description of FIG. 3 and FIG. 4 applies.

Figure 6:
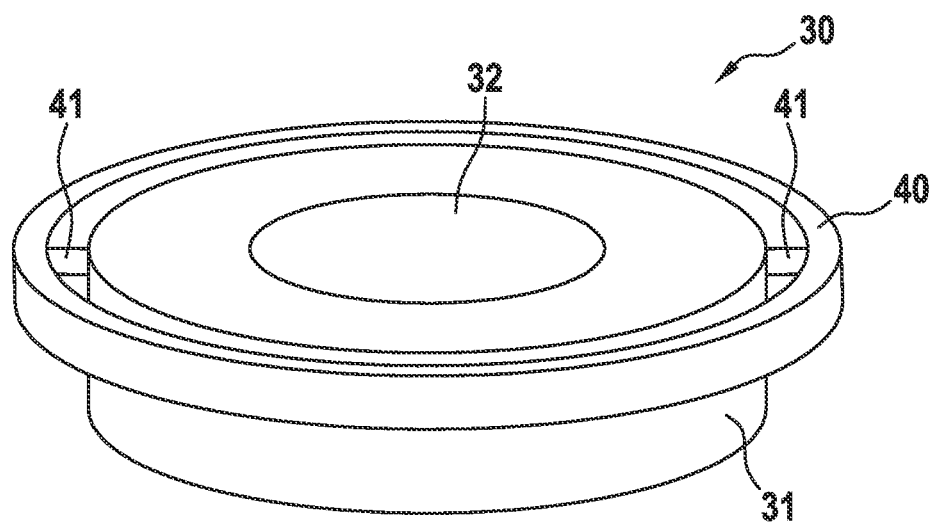
FIG. 6 shows a schematic illustration of an alternative optical arrangement.
Figure 7:
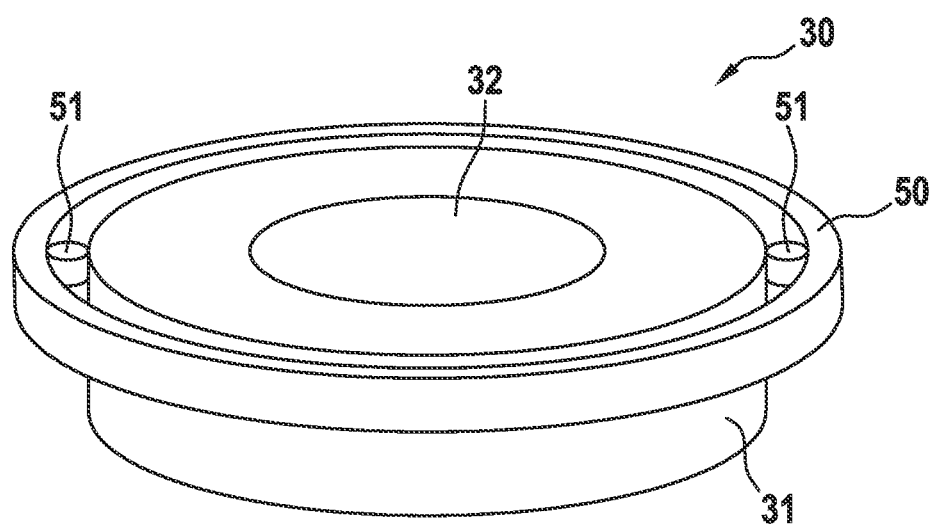
FIG. 7 shows a schematic illustration of a further alternative optical arrangement.

FIGS. 6 and 7 show alternative exemplary embodiments of optical arrangements 30 which are embodied to deform an optical element 31. The mechanisms of the deformation and the arrangement of the actuators in relation to the neutral axis correspond to what was the in the description of FIGS. 3 to 5, which is why the neutral axis 36 and the optical axis 35 are not illustrated in FIGS. 6 and 7.

FIG. 6 shows a schematic illustration of an optical arrangement 30 which, in addition to the optical element 31 with the optically effective surface 32, includes a tension ring 40 and connecting pieces 41. The tension ring 40 is embodied in such a way that the internal diameter of the tension ring 40 can be varied. This can be implemented by a ring embodied like a screw clamp or a pipe clamp, with the screws being driven by a stepper motor, for example, or being replaced by piezo elements. By reducing the internal diameter of the tension ring 40, the arising force is transferred onto the connecting pieces 41 and subsequently onto the optical element 31. This leads to a deformation of the optical element 31 according to the same mechanisms as described in FIGS. 3 and 4, and hence to the deformation of the optically effective surface 32.

FIG. 7 shows a schematic illustration of a further alternative of an optical arrangement 30, wherein the latter includes a rigid counter bearing 50, embodied as a ring, for the actuators 51. These are arranged between the counter bearing 50 and the optical element 31. For the tangential deformation of the optically effective surface 32, the actuators 51 always act in opposing pairs such that the force of the actuators 51 is advantageously averaged out over the counter bearing 50. In this case, too, there is no need to connect the actuators 51 to a counter bearing outside of the optical arrangement 30, advantageously simplifying the situation and position control of the optical arrangement 30.

Figure 8:
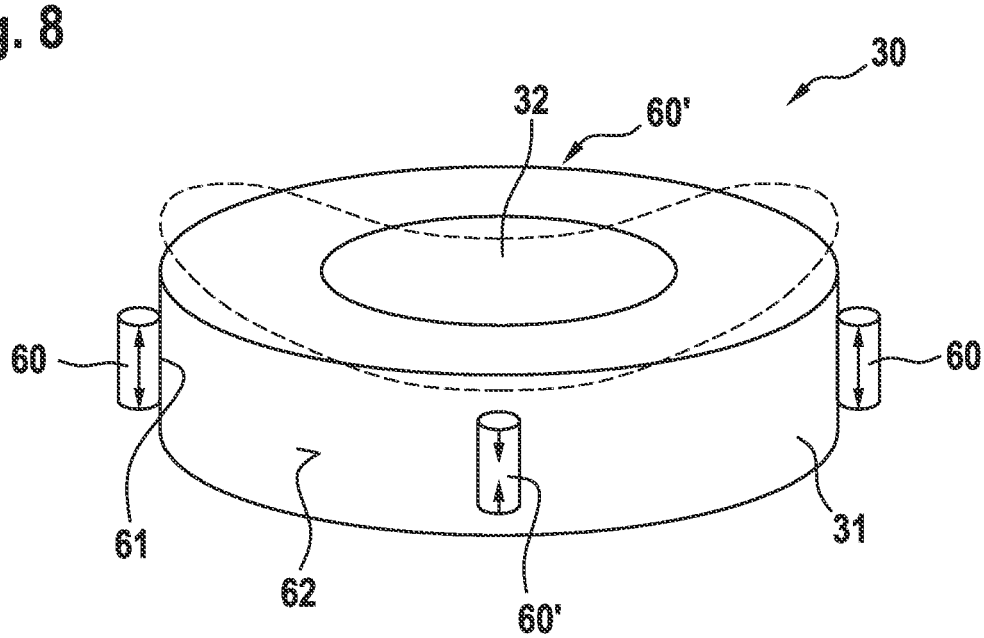
FIG. 8 shows a schematic illustration of a further alternative optical arrangement.

FIG. 8 shows a schematic illustration of a further alternative of an optical arrangement 30, wherein the actuators 60 are fastened to the lateral surface 62 of the optical element 31 via an adhesive 61. The actuators 60 transfer the forces, whose directional effect is indicated by arrows, to the lateral surface 62 via the adhesive 61. This brings about a local reduction in the height of the optical element 31 and hence a deformation of the optically effective surface 32, which in turn has as a consequence the deformation of the optically effective surface 32. To set a second harmonic tangential deformation, which is indicated by the dashed lines in FIG. 8, the first actuator pair 60 expands, as a result of which there is a local increase in the height of the optical element 31. At the same time, the second actuator pair 60' contracts (the second actuator being covered), as a result of which there is a local reduction in the height of the optical element 31.

All alternatives of an optical arrangement shown in FIGS. 3 to 8 are able to bring about an intrinsic deformation of the optical element 31 and its optically effective surface 32. In the process, the forces that bring about a deformation of the optical element 31 are not supported at a structure outside of the optical arrangement 30.

LIST OF REFERENCE SIGNS

1 Projection exposure apparatus
2 Facet mirror
3 Light source
4 Illumination optical unit
5 Object field
6 Object plane
7 Reticle
8 Reticle holder
9 Projection optical unit
10 Image field
11 Image plane
12 Wafer
13 Wafer holder
14 EUV radiation
15 Intermediate focal plane
16 Pupil facet mirror
17 Assembly
18 Mirror (illumination optical unit)
19 Mirror (illumination optical unit)
20 Mirror (illumination optical unit)
21-25 Mirror (projection optical unit)
30 Optical arrangement
31 Optical element/mirror (projection optical unit)
32 Optically effective surface
33 Cutout
34 Actuator
35 Optical axis
36 Neutral axis
37, 37' Contact point
38, 38' Actuator end surface
39 Actuator lateral surface
40 Tension ring
41 Connecting piece
50 Counter bearing
51 Actuator
60, 60' Actuator
61 Adhesive
62 Optical element lateral surface
70 Vertex
71 Point of intersection

What is claimed is:

1. An apparatus, comprising:
    an optical arrangement comprising an optical element which comprises an optically effective surface; and
    an actuator embedded in the optical element,
    wherein:
        the actuator is outside the optically effective surface;
        the optically effective surface has an outer perimeter;
        the actuator is outside a region encompassed by a projection of the outer perimeter of the optically effective surface in a direction perpendicular to the outer perimeter of the optically effective surface;
        the actuator is configured to deform the optically effective surface; and
        the apparatus is a semiconductor lithography projection exposure apparatus.

2. The apparatus of claim 1, wherein a portion of the actuator is in direct contact with the optical element.

3. The apparatus of claim 1, wherein the actuator is embedded in a prestressed state.

4. The apparatus of claim 1, wherein the actuator is configured to deform the optically effective surface via a laterally acting force of the actuator.

5. The apparatus of claim 1, wherein the actuator is configured to apply a force to the optical element at a point that is level with a neutral axis of the optical element.

6. The apparatus of claim 1, wherein the actuator is configured to apply a force to the optical element at a point that is above or below the level of a neutral axis of the optical element.

7. The apparatus of claim 1, wherein the actuator has a principal direction of motion, and the actuator is configured to expand in its principal direction of motion to deform the optically effective surface.

8. The apparatus of claim 1, wherein the actuator has a principal direction of motion, and the actuator is configured to expand perpendicular to its principal direction of motion to deform the optically effective surface.

9. The apparatus of claim 1, wherein the actuator comprises an end surface in contact with the optical element.

10. The apparatus of claim 1, wherein the actuator comprises a lateral surface, and at least a portion of the lateral surface contacts the optical element.

11. The apparatus of claim 1, wherein the apparatus comprises a plurality of actuators configured to deform the optically effective surface with a deformation selected from the group consisting of a second harmonic tangential deformation, a third harmonic tangential deformation, and a higher harmonic tangential deformation.

12. The apparatus of claim 1, wherein the optical element comprises a single lens.

13. The apparatus of claim 1, wherein the optical element comprises a mirror.

14. The apparatus of claim 1, wherein the actuator comprises a piezo element.

15. The apparatus of claim 1, wherein the actuator is integrated into the optical element.

16. The apparatus of claim 1, wherein the optical element comprises a cutout, and the actuator is in the cutout.

17. The apparatus of claim 1, wherein:
the optically effective surface defines a first plane;
the optical element comprises a second surface opposite the optically effective surface;
the second surface defines a second plane; and
the actuator is between the first and second planes.

18. The apparatus of claim 1, further comprising a holder configured to hold the optical element, wherein the actuator is not between the holder and the optical element.

19. The apparatus of claim 1, further comprising a holder configured to hold the optical element, wherein the actuator is not in the holder.

20. The apparatus of claim 1, wherein the apparatus comprises a projection optical unit, and the projection optical unit comprises the arrangement.

* * * * *